(12) United States Patent
Fung

(10) Patent No.: US 10,038,094 B2
(45) Date of Patent: Jul. 31, 2018

(54) FINFET STRUCTURE AND METHODS THEREOF

(71) Applicant: Taiwan Semiconductor Manufacturing Co., Ltd., Hsin-Chu (TW)

(72) Inventor: Ka-Hing Fung, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1 day.

(21) Appl. No.: 15/355,944

(22) Filed: Nov. 18, 2016

(65) Prior Publication Data
US 2017/0345933 A1     Nov. 30, 2017

Related U.S. Application Data

(60) Provisional application No. 62/343,644, filed on May 31, 2016.

(51) Int. Cl.
| | |
|---|---|
| H01L 21/02 | (2006.01) |
| H01L 29/78 | (2006.01) |
| H01L 21/311 | (2006.01) |
| H01L 29/08 | (2006.01) |
| H01L 29/165 | (2006.01) |

(Continued)

(52) U.S. Cl.
CPC .... *H01L 29/7848* (2013.01); *H01L 21/02532* (2013.01); *H01L 21/31111* (2013.01); *H01L 29/0847* (2013.01); *H01L 29/165* (2013.01); *H01L 29/45* (2013.01); *H01L 29/665* (2013.01); *H01L 29/66659* (2013.01); *H01L 29/66795* (2013.01); *H01L 29/7835* (2013.01); *H01L 29/7851* (2013.01)

(58) Field of Classification Search
CPC ........................................................ H01L 21/02
See application file for complete search history.

(56) References Cited

U.S. PATENT DOCUMENTS

| | | |
|---|---|---|
| 8,487,378 B2 | 7/2013 | Goto et al. |
| 8,729,634 B2 | 5/2014 | Shen et al. |

(Continued)

OTHER PUBLICATIONS

Natarajan, S. et al., "A 14nm Logic Technology Featuring $2^{nd}$-Generation FinFET Transistors, Air-Gapped Interconnects, Self-Aligned Double Patterning and a $0.0588 \mu m^2$ SRAM cell size", IEEE International Electron Devices Meeting (IEDM), 2014, pp. 3.7.1-3.7.3.

*Primary Examiner* — Marvin Payen
(74) *Attorney, Agent, or Firm* — Haynes and Boone, LLP

(57) ABSTRACT

A method and structure for providing a unique structure for FinFET S/D features described a semiconductor device including a substrate having a fin extending therefrom, the fin including a channel region, and source and drain regions adjacent to and on either side of the channel region. In various embodiments, a gate structure is disposed over the channel region, and the gate structure includes a metal layer disposed over a dielectric layer. In some examples, a first epitaxial layer at least partially embedded within the source and drain regions. In addition, a second epitaxial layer is disposed over the first epitaxial layer, where a top surface of the second epitaxial layer is higher than a top surface of the metal layer along a direction normal to the substrate. In various examples, a silicide layer is also disposed over, and in contact with, the second epitaxial layer.

20 Claims, 10 Drawing Sheets

(51) Int. Cl.
 *H01L 29/45* (2006.01)
 *H01L 29/66* (2006.01)

(56) References Cited

U.S. PATENT DOCUMENTS

| | | |
|---|---|---|
| 8,826,213 B1 | 9/2014 | Ho et al. |
| 8,887,106 B2 | 11/2014 | Ho et al. |
| 9,293,580 B2 | 3/2016 | Fung et al. |
| 2011/0147840 A1 | 6/2011 | Cea et al. |
| 2014/0282326 A1 | 9/2014 | Chen et al. |

FINFET STRUCTURE AND METHODS THEREOF

CROSS-REFERENCE TO RELATED APPLICATIONS

This application claims the benefit of U.S. Provisional Application No. 62/343,644, filed May 31, 2016, which is hereby incorporated by reference in its entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. In at least some examples, FinFET fabrication may include epitaxial growth of source and drain regions in each of a p-type FinFET and an n-type FinFET, for example, by way of a dual-epi process. However, conventional dual-epi processes are limited inasmuch as contact resistivity and contact area (e.g., silicide contact area) cannot be improved (e.g., increased) due to pitch scaling, without a trade-off in capacitance, and the choice of materials is limited by the high thermal budget of front-end-of-line (FEOL) processes. The possibility to improve source/drain stressors (e.g., stress applied to a device channel) is also limited for similar reasons. Moreover, there is a stress reduction that occurs due to the conventional pre-amorphization implant (PAI) process (e.g., used in conjunction with silicide formation). Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-6A, 9A, and 10A are provided along a cross-sectional view substantially similar to section AA' of FIG. 1;

FIGS. 3B-6B, 9B, and 10B are provided along cross-sectional view substantially similar to section BB' of FIG. 1.

DETAILED DESCRIPTION

Figure 1:
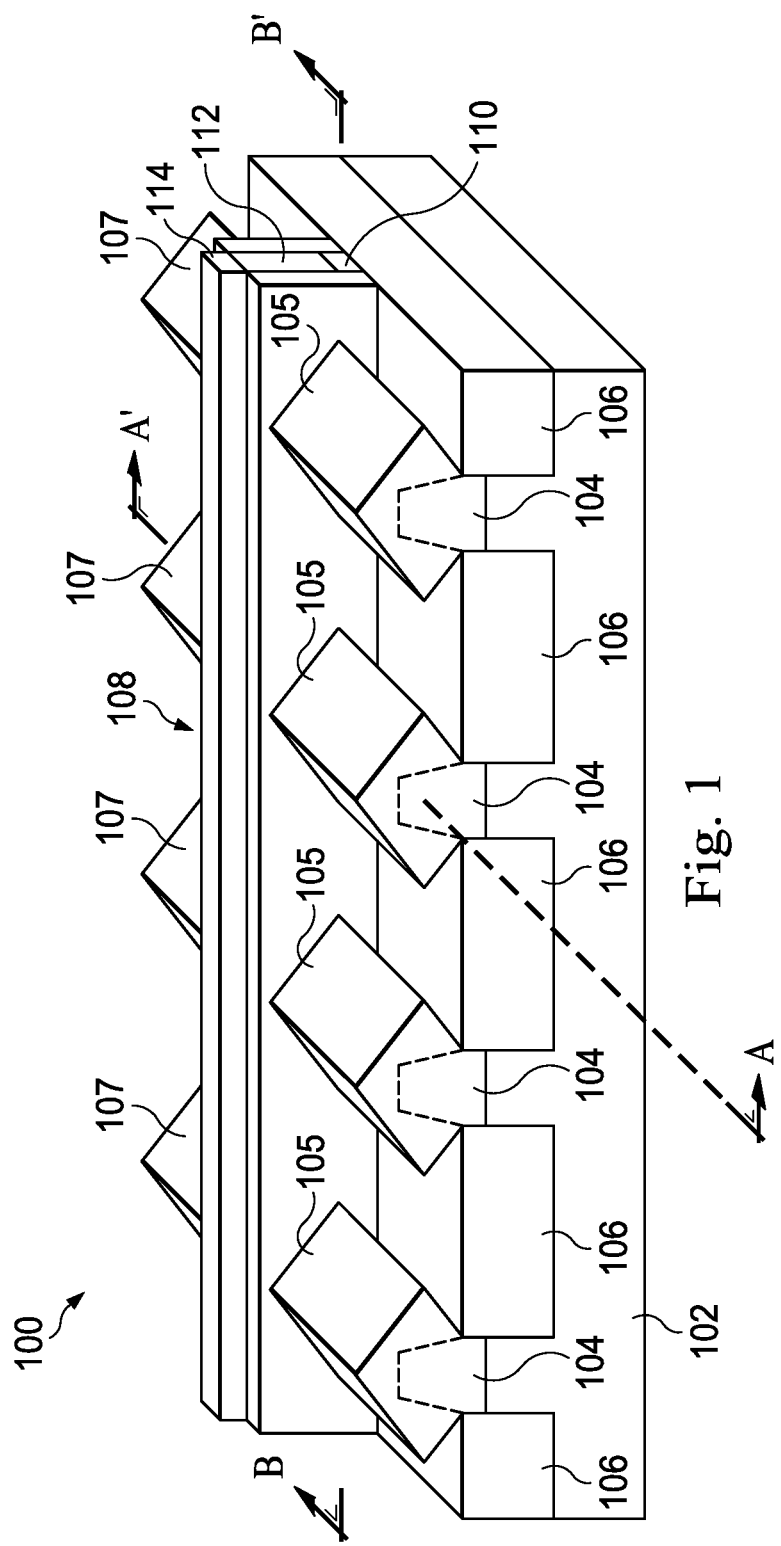
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Illustrated in FIG. 1 is a FinFET device 100. The FinFET device 100 includes one or more fin-based, multi-gate field-effect transistors (FETs). The FinFET device 100 includes a substrate 102, at least one fin element 104 extending from the substrate 102, isolation regions 106, and a gate structure 108 disposed on and around the fin-element 104. The substrate 102 may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, in some embodiments, the substrate may include an epitaxial layer (epi-layer), the substrate may be strained for performance enhancement, the substrate may include a silicon-on-insulator (SOI) structure, and/or the substrate may have other suitable enhancement features.

The fin-element 104, like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the substrate while an etch process forms recesses into the silicon layer, thereby leaving an extending fin 104. The recesses may be etched using a dry etch (e.g., chemical oxide removal), a wet etch, and/or other suitable processes. Numerous other embodiments of methods to form the fins 104 on the substrate 102 may also be used.

Each of the plurality of fins 104 also include a source region 105 and a drain region 107 where the source/drain regions 105, 107 are formed in, on, and/or surrounding the fin 104. The source/drain regions 105, 107 may be epitaxially grown over the fins 104. A channel region of a transistor is disposed within the fin 104, underlying the gate structure 108, along a plane substantially parallel to a plane defined by section AA' of FIG. 1. In some examples, the channel region of the fin includes a high-mobility material such as germanium, as well as any of the compound semiconductors or alloy semiconductors discussed above and/or combinations thereof. High-mobility materials include those materials with an electron mobility greater than silicon. For example, higher than Si which has an intrinsic electron mobility at room temperature (300 K) of around 1350 $cm^2/V$-s and a hole mobility of around 480 $cm^2/V$-s.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 102. The trenches may then be filled with isolating material, followed by a chemical mechanical polishing (CMP) process. However, other embodiments are possible. In some embodiments, the isolation regions 106 may include a multi-layer structure, for example, having one or more liner layers.

The gate structure 108 includes a gate stack having an interfacial layer 110 formed over the channel region of the fin 104, a gate dielectric layer 112 formed over the interfacial layer 110, and a metal layer 114 formed over the gate dielectric layer 112. The interfacial layer 110 may include a dielectric material such as silicon oxide layer ($SiO_2$) or silicon oxynitride (SiON). The interfacial layer 110 may be formed by chemical oxidation, thermal oxidation, atomic layer deposition (ALD), chemical vapor deposition (CVD), and/or other suitable method. The gate dielectric layer 112 may include a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, combinations thereof, or other suitable material. In still other embodiments, the gate dielectric layer may include silicon dioxide or other suitable dielectric. The dielectric layer may be formed by ALD, physical vapor deposition (PVD), oxidation, and/or other suitable methods. The metal layer 114 may include a conductive layer such as W, TiN, TaN, WN, Re, Ir, Ru, Mo, Al, Cu, Co, Ni, combinations thereof, and/or other suitable compositions. In some embodiments, the metal layer 114 may include a first metal material for N-type FinFETs and a second metal material for P-type FinFETs. Thus the FinFET device 100 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin 104. Similarly, for example, the second metal material (e.g., for P-type devices) may include metals having a work function substantially aligned with a work function of the substrate valence band, or at least substantially aligned with a work function of the valence band of the channel region of the fin 104. Thus, the metal layer 114 may provide a gate electrode for the FinFET device 100, including both N-type and P-type FinFET devices 100. In some embodiments, the metal layer 114 may alternately include a polysilicon layer. The metal layer 114 may be formed using PVD, CVD, electron beam (e-beam) evaporation, and/or other suitable process. In some embodiments, sidewall spacers are formed on sidewalls of the gate structure 108. The sidewall spacers may include a dielectric material such as silicon oxide, silicon nitride, silicon carbide, silicon oxynitride, or combinations thereof.

As discussed above, fabrication of a FinFET device (e.g., the FinFET device 100) may include epitaxial growth of source and drain regions (e.g., the source/drain regions 105, 107) in each of a p-type FinFET and an n-type FinFET, for example, by way of a dual-epi process. However, conventional dual-epi processes are limited inasmuch as contact resistivity and contact area (e.g., silicide contact area) cannot be improved (e.g., increased) due to pitch scaling, without a trade-off in capacitance, and the choice of materials is limited by the high thermal budget of front-end-of-line (FEOL) processes. The possibility to improve source/drain stressors (e.g., stress applied to a device channel) is also limited for similar reasons. Moreover, there is a stress reduction that occurs due to the conventional pre-amorphization implant (PAI) process (e.g., used in conjunction with silicide formation). Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing a unique structure for FinFET source and drain (S/D) features that provide a reduced S/D contact resistance, improved FinFET channel stress, and lower capacitance. By way of example, such S/D features include stacked epitaxial (EPI) layers in each of the S/D regions. In some embodiments, the stacked EPI layers in each of the S/D regions may be referred to as cascaded EPI features. In some examples, the cascaded EPI features include a first EPI layer that is partially embedded in a fin over a semiconductor substrate, and a second EPI layer on top of the first EPI layer. By way of example, the two stacked EPI layers may be lattice-connected, and may have the same or different semiconductor material(s). In some embodiments including an n-type FinFET, the second EPI layer may have a lattice constant less than that of silicon (Si). In some embodiments including a p-type FinFET, the second EPI layer may have a lattice constant greater than that of silicon germanium (SiGe). In various examples, the second EPI layer may be partially self-aligned with the first EPI layer, and the shape of the second EPI layer may be defined at least in part by an opening in an inter-layer dielectric (ILD) layer disposed over the semiconductor substrate. In some cases, the FinFET device may further include a silicide feature over a top surface of the second EPI layer, where the silicide feature has an extended surface area for reducing S/D contact resistance. Additional embodiments and advantages are discussed below and/or will be evident to those skilled in the art in possession of this disclosure.

Figure 2:
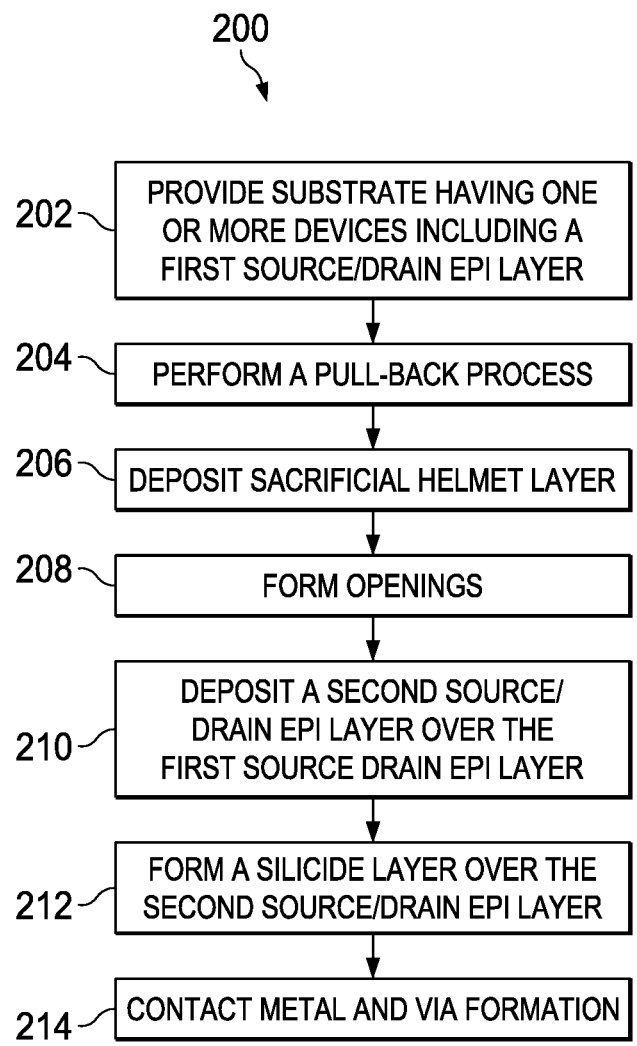
FIG. 2 is a flow chart of a method of fabricating a FinFET device according to one or more aspects of the present disclosure.

Referring now to FIG. 2, illustrated is a method 200 of fabricating a semiconductor device including a FinFET device. The method 200 may be used to implement a fin-based semiconductor device including methods for providing cascaded EPI features in each of a FinFET source and drain region. In some embodiments, the method 200 may be used to fabricate the device 100, described above with reference to FIG. 1. Thus, one or more aspects discussed above with reference to the device 100 may also apply to the method 200. Additionally, FIGS. 3A, 3B, 4A, 4B, 5A, 5B, 6A, 6B, 7, 8, 9A, 9B, 10A and 10B provide cross-sectional views of an exemplary device 300 fabricated according to one or more steps of the method 200 of FIG. 2.

It is understood that parts of the method 200 and/or the semiconductor device 300 may be fabricated by a well-known complementary metal-oxide-semiconductor (CMOS) technology process flow, and thus some processes are only briefly described herein. In addition, as described above, the device 300 may share aspects of the device 100, thus some aspects and/or processes of the device 300 are only discussed briefly for purposes of clarity in understanding. Further, the semiconductor device 300 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device 300 includes a plurality of semiconductor devices (e.g., transistors), which may be interconnected.

In various embodiments, the device 300 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof.

Referring now to the method 200, the method 200 begins at block 202 where a substrate including one or more devices, including a first source/drain epitaxial (EPI) layer, is provided. In some embodiments, the one or more devices may include one or more FinFET devices having fin elements extending from the substrate, isolation regions to separate the one or more FinFET devices, and a gate structure formed over a channel region of the fin elements. The substrate may be substantially similar to the substrate 102 discussed above with reference to FIG. 1. The fins and isolation regions may also be substantially similar to the fin elements 104 and isolation regions 106, also described above with reference to the device 100 of FIG. 1. Additionally, the gate structure may be substantially similar to the gate structure 108 described above with reference to the device 100 of FIG. 1. Referring to the example of FIGS. 3A/3B, illustrated is a semiconductor device 300 including a semiconductor substrate from which a fin element 302 extends. The device 300 further illustrates channel regions 304 within the fin element 302 of neighboring FinFET devices and a source/drain structure 306 disposed between the channel regions 304. In various embodiments, the device 300 further includes a gate structure 308 disposed over each of the channel regions 304, and a nitride layer 310 disposed over each of the gate structures 308. In some examples, the nitride layer 310 may be referred to as a sacrificial layer. In some embodiments, the nitride layer 310 may be deposited by chemical vapor deposition (CVD), atomic layer deposition (ALD), physical vapor deposition (PVD), or other suitable process. In some embodiments, a portion of the gate structure 308 (e.g., a metal layer) may be etched back, for example, to form a recess within which the nitride layer 310 is formed. Sidewall spacers 312, substantially similar to those described above with reference to the device 100 of FIG. 1, may also be formed on sidewalls of the gate structures 308.

Figure 3A:
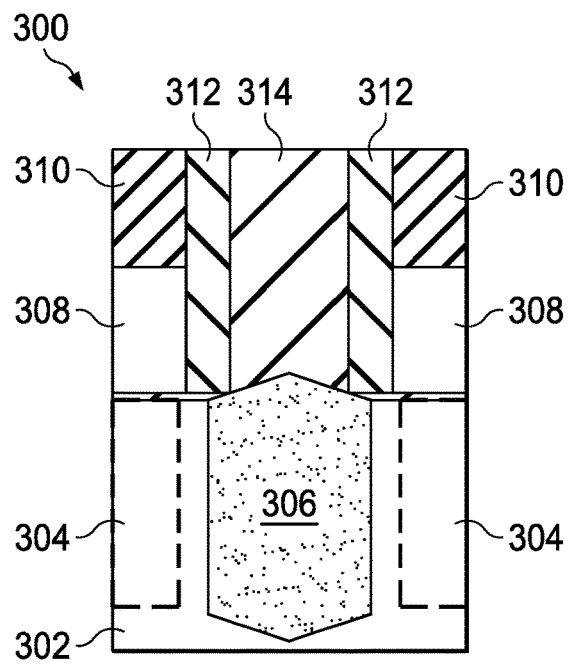
FIGS. 3A, 3B, 4A, 4B, 5A, 5B, 6A, 6B, 7, 8, 9A, 9B, 10A and 10B illustrate cross sectional views of an embodiment of a FinFET device corresponding to one or more steps of the method of FIG. 2.
Figure 3B:
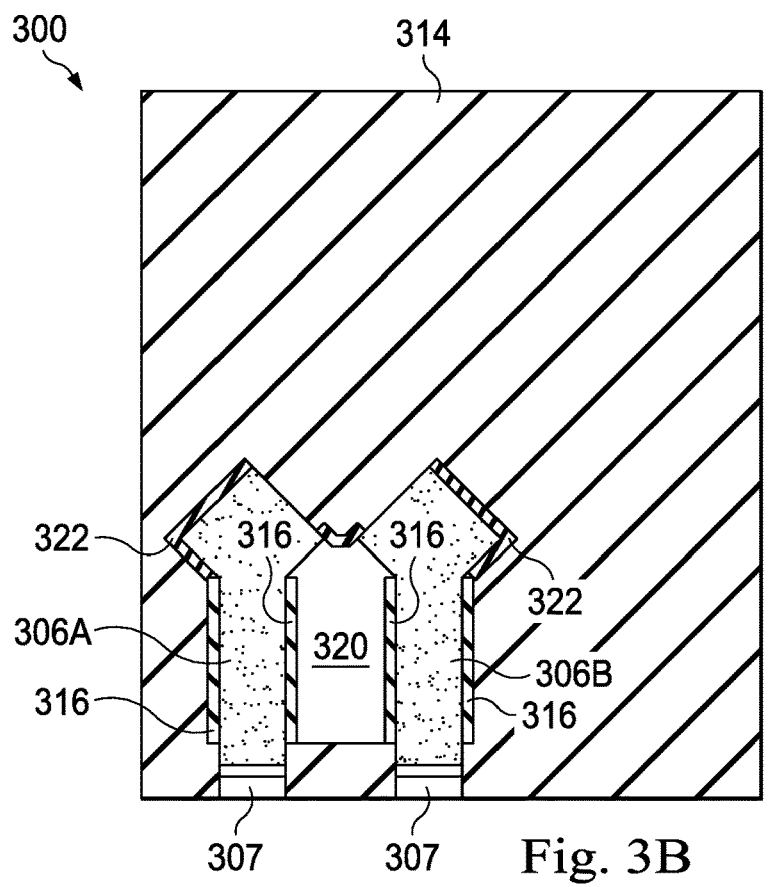
Figure 4A:
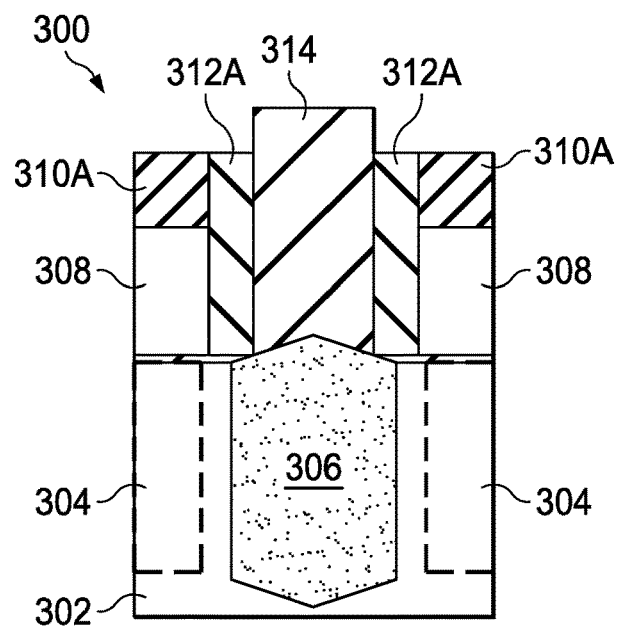
Figure 4B:
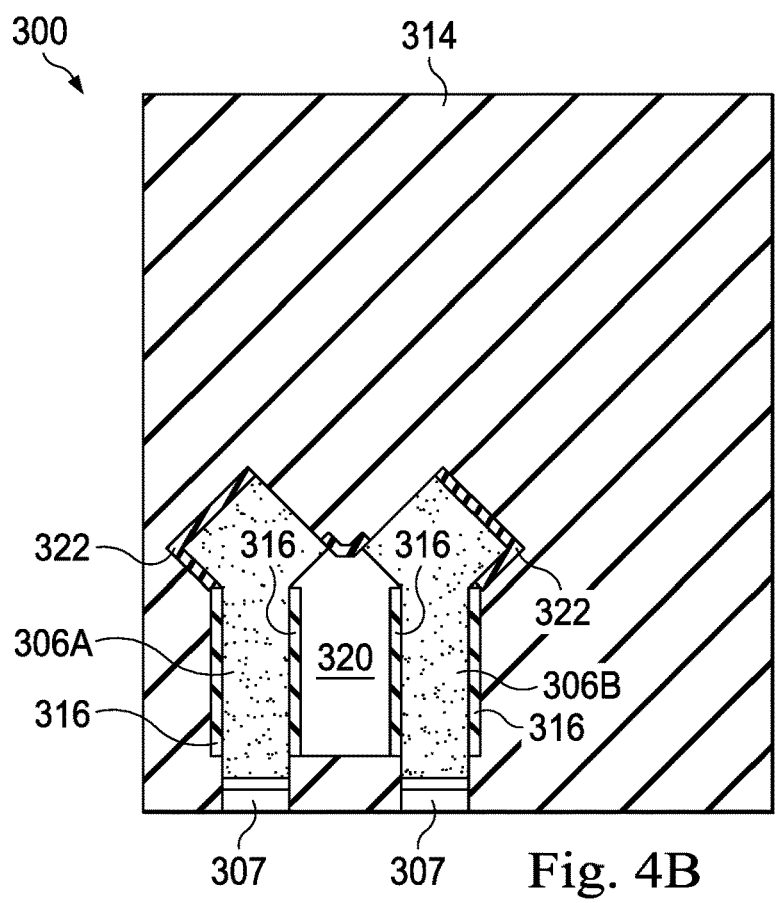
Figure 5A:
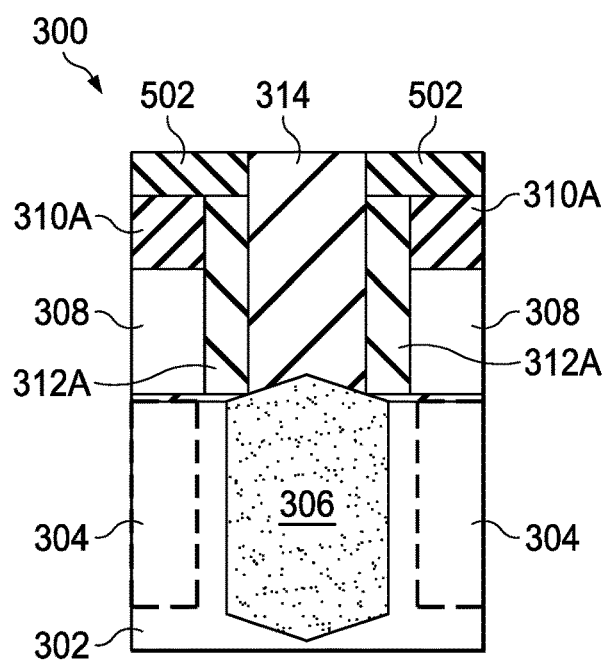
Figure 5B:
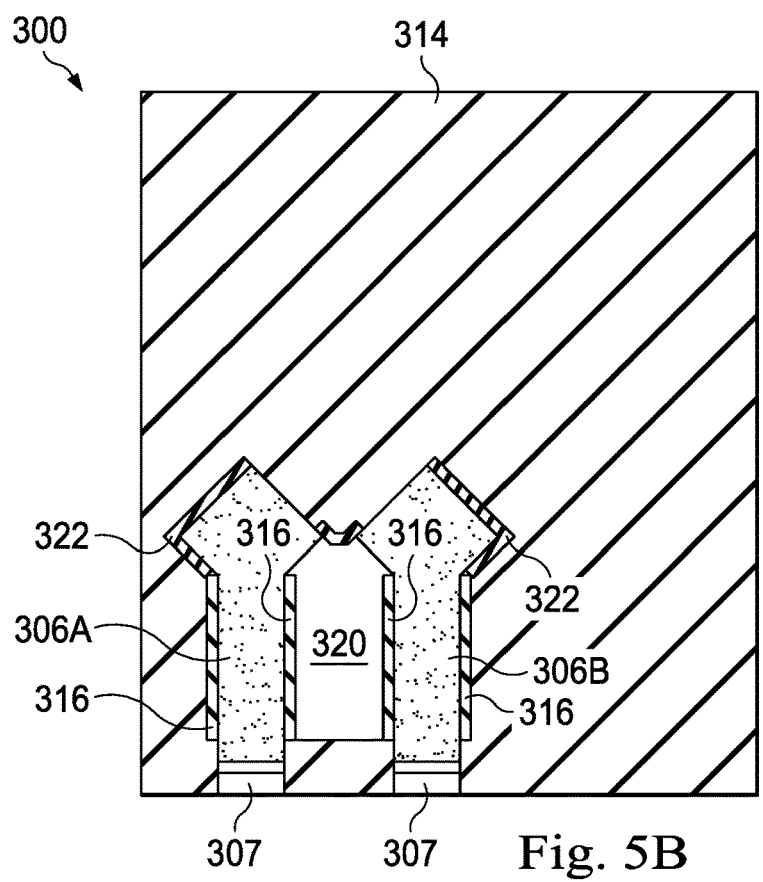

FIG. 3B, which provides a cross-sectional view substantially similar to section BB' of FIG. 1, shows neighboring source/drain structures 306A, 306B. In various examples, the source/drain structure 306 may include either of the source/drain structures 306A, 306B. By way of example, the source/drain structures 306A, 306B may be formed by epitaxially growing a semiconductor material layer (e.g., over fin portions 307). In various embodiments, the semiconductor material layer used to form the source/drain structures 306A, 306B may include Ge, Si, SiGeB, GaAs, AlGaAs, SiGe, GaAsP, SiP, or other suitable material. The source/drain structures 306A, 306B may be formed by one or more epitaxial (epi) processes. However, for purposes of this disclosure, the source/drain structures 306A/306B may be referred to a "first source/drain epitaxial layer". As such, and as described in more detail below, a "second source/drain epitaxial layer" is later formed over the first source/drain epitaxial layer, thereby forming the cascaded EPI features previously described. In addition, due to their location embedded within the fin 302, the source/drain structures 306, 306A, 306B may be referred to as "embedded source/drain epitaxial layers". In some embodiments, the source/drain structures 306A, 306B may be in-situ doped during the epi process. For example, in some embodiments, epitaxially grown SiGe source/drain structures 306A, 306B may be doped with boron to form SiGeB. In some embodiments, epitaxially grown Si epi source/drain structures 306A, 306B may be doped with carbon to form Si:C source/drain structures, phosphorous to form Si:P source/drain structures, or both carbon and phosphorous to form SiCP source/drain structures. In some embodiments, the source/drain structures 306A, 306B are not in-situ doped, and instead an implantation process is performed to dope the source/drain structures 306A, 306B. In some embodiments, formation of the source/drain structures 306A, 306B may be performed in separate processing sequences for each of N-type and P-type source/drain structures 306A, 306B. In some embodiments, after formation of the source/drain structures 306A, 306B, an epi anneal process may be performed. Additionally, in some embodiments, sidewall spacers 316 may be formed after formation of the source/drain structures 306A, 306B. In various embodiments, and depending for example on a spacing between the source/drain structures 306A, 306B, the source/drain structures 306A, 306B may merge (e.g., physically contact one another) to form a single, merged source/drain structure. Additionally, in some examples, a gap region 320 (e.g., a hollow void) may be formed in a space between the source/drain structures 306A, 306B, as shown in FIG. 3B.

As discussed above and shown for example in FIG. 3A, the source/drain structure 306 (or 306A, 306B) is disposed adjacent to a channel region (e.g., the channel regions 304). As such, the material selected to form the source/drain structures 306, 306A, 306B may be chosen so as to impart a desired amount of stress (e.g., tensile stress or compressive stress) to the adjacent channel region. In other words, a material used for the source/drain structures 306, 306A, 306B may be different than a material used for the channel region, thereby providing the desired stress. In at least some conventional processes, after formation of the desired channel stress (e.g., by way of an adjacent source/drain structure), subsequent processing steps such as a silicide pre-amorphization implant (PAI) or supplementary source/drain ion implantation can detrimentally impact the previously formed channel stress (e.g., undesired stress relaxation may occur). Embodiments of the present disclosure advantageously avoid these, as well as other, possible causes of stress relaxation by use of the cascaded source/drain structures, as described in more detail below.

Referring again to FIGS. 3A/3B, an interlayer dielectric (ILD) layer 314 is formed over the device 300. In some embodiments, a contact etch stop layer (CESL) 322 is also formed prior to forming the ILD layer 314. In some examples, the CESL 322 includes a silicon nitride layer, silicon oxide layer, a silicon oxynitride layer, and/or other materials known in the art. The CESL 322 may be formed by plasma-enhanced chemical vapor deposition (PECVD) process and/or other suitable deposition or oxidation processes. In some embodiments, the ILD layer 314 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 314 may be deposited by a PECVD process or other suitable deposition technique. In some embodiments, after formation of the ILD layer 314, the semiconductor device 300 may be subject to an anneal process, for example, to anneal the ILD layer 314. In some examples, a planarization process (e.g., a CMP process) may be performed to planarize a top surface of the semiconductor device 300.

In some embodiments, the method 200 then proceeds to block 204, where a pull-back process is performed. In some embodiments, the "pull-back" process may be equivalently referred to as an "etch-back" process. Referring to the example of FIGS. 4A/4B, a top portion of each of the nitride layers 310 (e.g., sacrificial layer) and the sidewall spacers 312 are recessed by way of the pull-back process, resulting in recessed nitride layers 310A and recessed sidewall spacers 312A. In some embodiments, the recessing process may include a dry etching process, a wet etching process, and/or a combination thereof.

In various embodiments, the method 200 then proceeds to block 206, where a sacrificial helmet layer is deposited. For example, with reference to the example of FIGS. 5A/5B, a sacrificial helmet layer 502 is deposited over the nitride layers 310A and the sidewall spacers 312A. In some embodiments, the sacrificial helmet layer 502 may include a polysilicon layer, a nitride layer (e.g., TiN, TaN), a metal-oxide layer such as $HfO_2$ or other high-k dielectric layer (e.g., such as those discussed above with reference to the gate dielectric layer 112), or other suitable dielectric material. In various embodiments, the sacrificial helmet layer 502 may be deposited by CVD, ALD, PVD, or other suitable process. In some examples, a material of the sacrificial helmet layer 502 may be different than a material used for the nitride layer 310 and/or a material used for the sidewall spacers 312. In various examples, the sacrificial helmet layer 502 is used to protect the nitride layers 310A, and thus the gate structure 308, and the sidewall spacers 312A. In some cases, the sacrificial helmet layer 502 is optional, and is thus not deposited.

By way of example, the method 200 then proceeds to block 208, where openings are formed. Referring to the example of FIGS. 6A/6B, source/drain openings 602, 604 are formed to provide access to the source/drain structures 306, 306A, 306B. By way of example, the openings 602, 604 may be formed by a suitable combination of lithographic patterning and etching (e.g., wet or dry etching) processes of the ILD layer 314. In some embodiments, portions of the CESL 322 exposed as a result of formation of the openings 602, 604 may be removed (e.g., by wet or dry etching). It is also noted that a size of the openings 602, 604 (e.g., length and width in a plane substantially parallel to a surface of the substrate 102) may be adjusted independently and as desired, for each of a source and a drain of a given device such as the device 300. By way of example, a larger opening may be used for one of a device source or drain to provide a smaller resistance at the one of the source or the drain having the larger opening, as described in more detail below. Alternatively, in some embodiments, a similarly large opening may be used for both of a device source and drain. Additional details of the size of the openings 602, 604 will be discussed below with reference to FIG. 11. Referring again to the example of FIGS. 6A/6B, and in at least some conventional processes, a silicide pre-amorphization implant (PAI), silicide formation, and contact layer metal deposition over the now exposed source/drain structures 306, 306A, 306B, as well as a possible source/drain anneal, may be performed at this stage. However, as discussed above, this can lead to undesirable stress relaxation in an adjacent device channel (e.g., channel regions 304). Thus, as described in more detail below, embodiments of the present disclosure instead provide for formation of a second epitaxial source drain layer over the source/drain structures 306, 306A, 306B, for example, prior to any PAI, silicide formation, or contact layer metal deposition. In addition, and in various embodiments, the sacrificial helmet layer 502, if present, may be removed after formation of the openings 602, 604. By way of example, removal of the sacrificial helmet layer 502 may be performed by using a dry etching process, a wet etching process, and/or a combination thereof.

Figure 7:
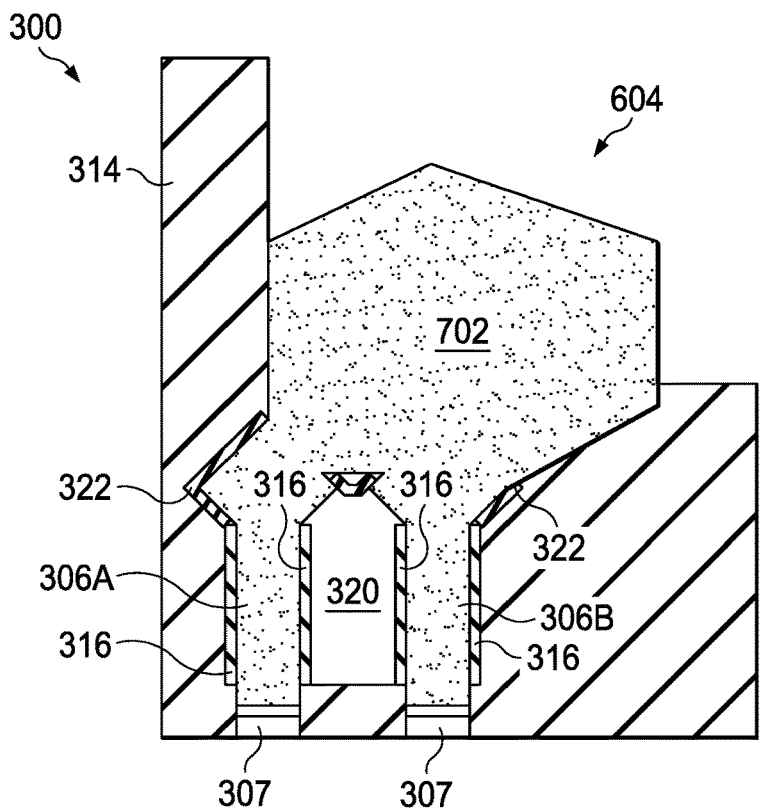
Figure 8:
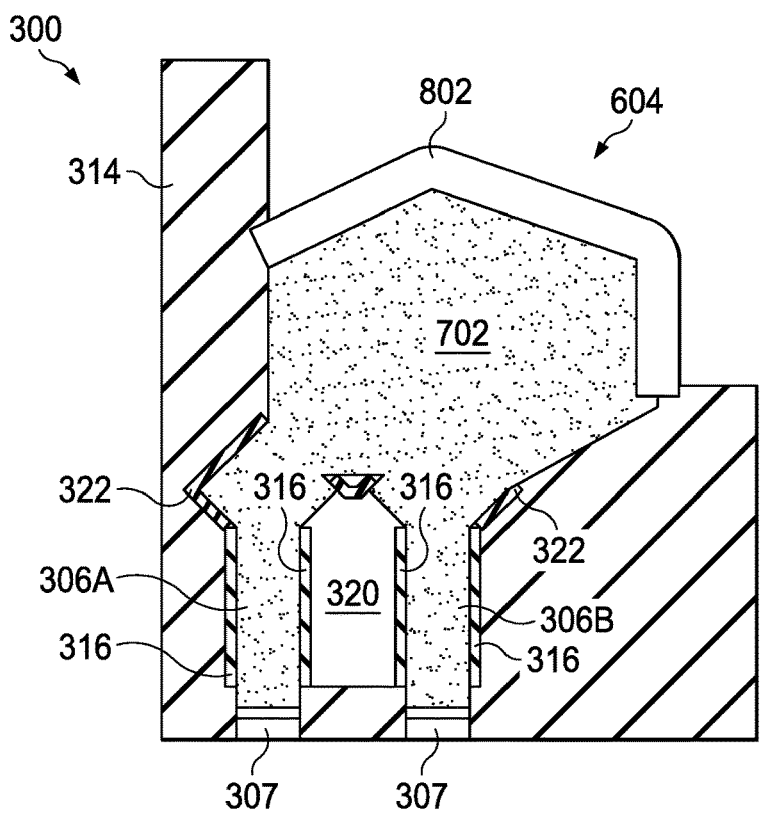

In some embodiments, the method 200 then proceeds to block 210, where a second source/drain epitaxial (EPI) layer is formed over the first source/drain EPI layer. In some embodiments, formation of the second source/drain EPI layer may be performed in separate processing sequences for each of an N-type device and a P-type device. For clarity of discussion, the process is described for the exemplary device 300, which may include either an N-type device or a P-type device. Referring to the example of FIGS. 6B and 7, a second epitaxial layer 702 is formed over the first epitaxial layer (e.g., over the source/drain structures 306A/306B) within the opening 604 (as well as within the opening 602). In some embodiments, if the first epitaxial layer was not sufficiently grown (e.g., to a desired height), for instance because of merging of the source/drain structures 306A/306B, the first epitaxial layer may be described as an "under-filled first epitaxial layer". In such cases, the second epitaxial layer 702 may thus also serve to fill the under-filled first epitaxial layer. By way of example, the second epitaxial layer 702 may be lattice-connected to the first epitaxial layer, and may include the same or different semiconductor material(s) as the first semiconductor layer. In some embodiments including an n-type FinFET, the second epitaxial layer 702 may include a material with a lattice constant less than that of silicon (Si) (e.g., such as SiCP, a Ga compound, an In compound, an As compound, or other suitable material). In some embodiments including a p-type FinFET, the second epitaxial layer 702 may include a material with a lattice constant greater than that of silicon germanium (SiGe) (e.g., such as SiGeB with a concentration of Ge greater than about 60%, GeB, SnGeB, or other suitable material). To be sure, in some embodiments, the second epitaxial layer 702 may also or alternatively include Ge, Si, GaAs, AlGaAs, SiGe, GaAsP, SiP, GaP, Si-doped GaP, or other suitable material. As shown in FIG. 7, the openings (e.g., the openings 602, 604) may be formed, as described above, such that the second epitaxial layer 702 is at least partially self-aligned to the source/drain structures 306A/306B. Moreover, in some embodiments, the shape of the second epitaxial layer 702 may be defined at least in part by the openings 602, 604, as described in more detail below with reference to FIG. 11. For example, in some cases, the second epitaxial layer 702 may have an extended surface area (e.g., along a plane substantially parallel to a surface of the substrate 102), upon which a silicide layer is formed, as discussed below. In some embodiments, after formation of the second epitaxial layer 702, an epi anneal process may be performed.

Thereafter, in some embodiments, the method 200 then proceeds to block 212, where a silicide layer is formed over the second source/drain EPI layer. Referring to the example of FIGS. 7 and 8, a silicide layer 802 is formed over the second epitaxial layer 702. By way of example, the silicide layer 802 may include the same or different material(s) for each of an N-type and P-type device. In some embodiments, the silicide layer 802 may include a dual silicide process and structure, where a first material is used for an N-type device, and a second material is used for a P-type device. For instance, in some cases, the silicide layer 802 may include TiSi, Yb-doped TiSi, Zn-doped TiSi, and/or Yb/Zn-doped TiSi for an N-type device. In addition, and in some embodiments, the silicide layer 802 may include NiSi and/or Pt-doped NiSi for a P-type device. In some cases, TiSi may be used as the silicide layer 802 for both N-type and P-type devices. In some embodiments, the silicide layer 802 may also include a plurality of metal layers of the same or different material(s).

In some cases, the silicide layer 802 has an extended surface area (e.g., along a plane substantially parallel to a surface of the substrate 102), that serves to reduce S/D contact resistance. Additionally, and in some embodiments, an InGaAs layer may be formed between the second epitaxial layer 702 and the silicide layer 802 to further reduce the S/D contact resistance. In some examples, after formation of the second epitaxial layer 702 and as part of formation of the silicide layer 802, a pre-amorphization implant (PAI), metal layer deposition, and/or anneal may be performed. In accordance with embodiments of the present disclosure, formation of the silicide layer 802 after formation of the second epitaxial layer 702 serves to avoid the undesirable stress relaxation in an adjacent device channel (e.g., channel regions 304), as discussed above. Recall, as discussed above, that in at least some conventional processes a silicide layer is formed directly over the exposed source/drain structures 306, 306A, 306B, which can result in stress relaxation (e.g., in a device channel region). By forming the silicide layer 802 at a higher level, for example over the second epitaxial layer 702 and a distance away from an adjacent channel region, any previously introduced channel stress (e.g., that may be provided at least in part by the source/drain structures 306, 306A, 306B) is maintained (e.g., stress relaxation is avoided). More specifically, a silicide PAI process (e.g., performed as part of the formation of the silicide layer 802), supplementary source/drain ion implantation, silicidation anneal, or other such processes will not detrimentally impact the stress (e.g., channel stress).

Figure 9A:
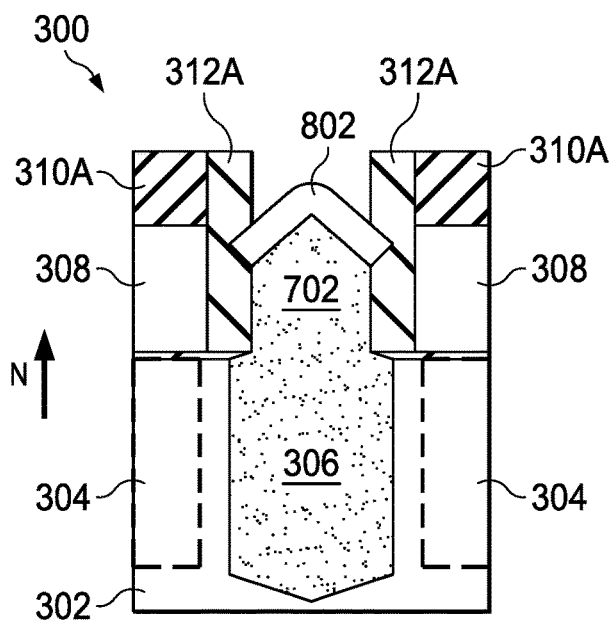
Figure 9B:
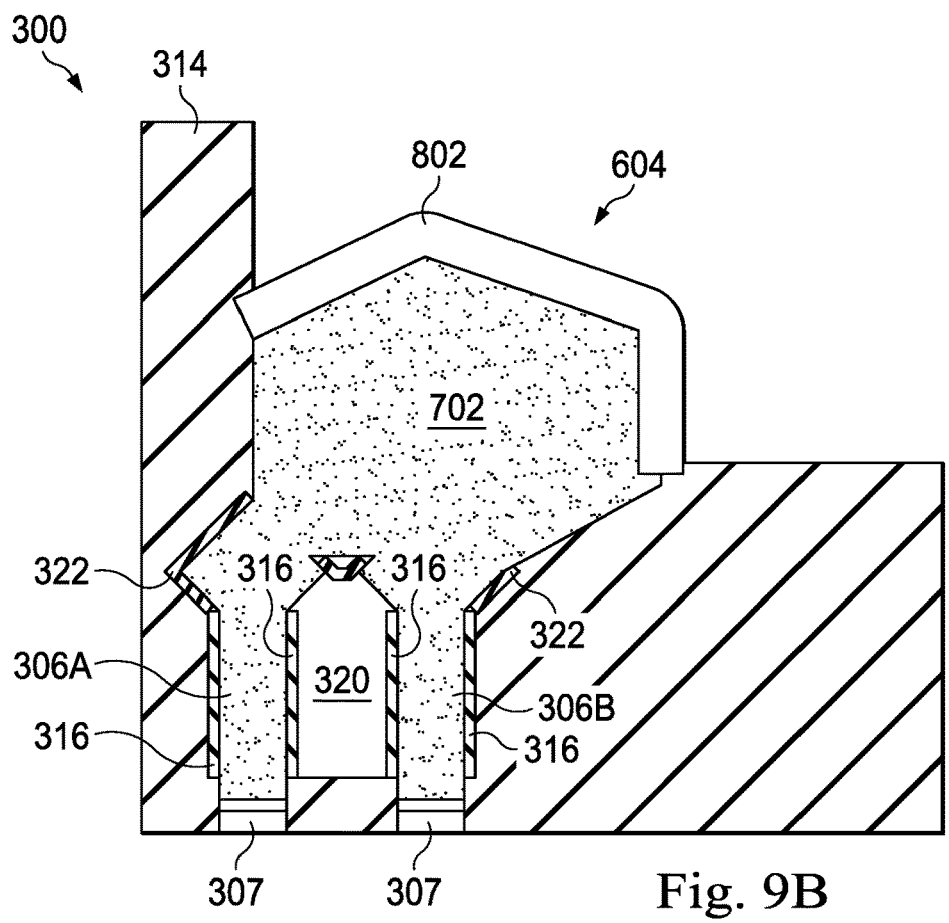
Figure 10A:
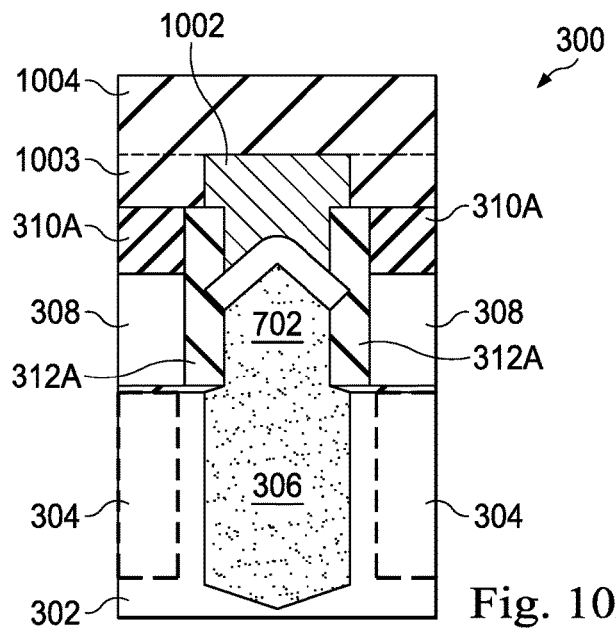
Figure 10B:
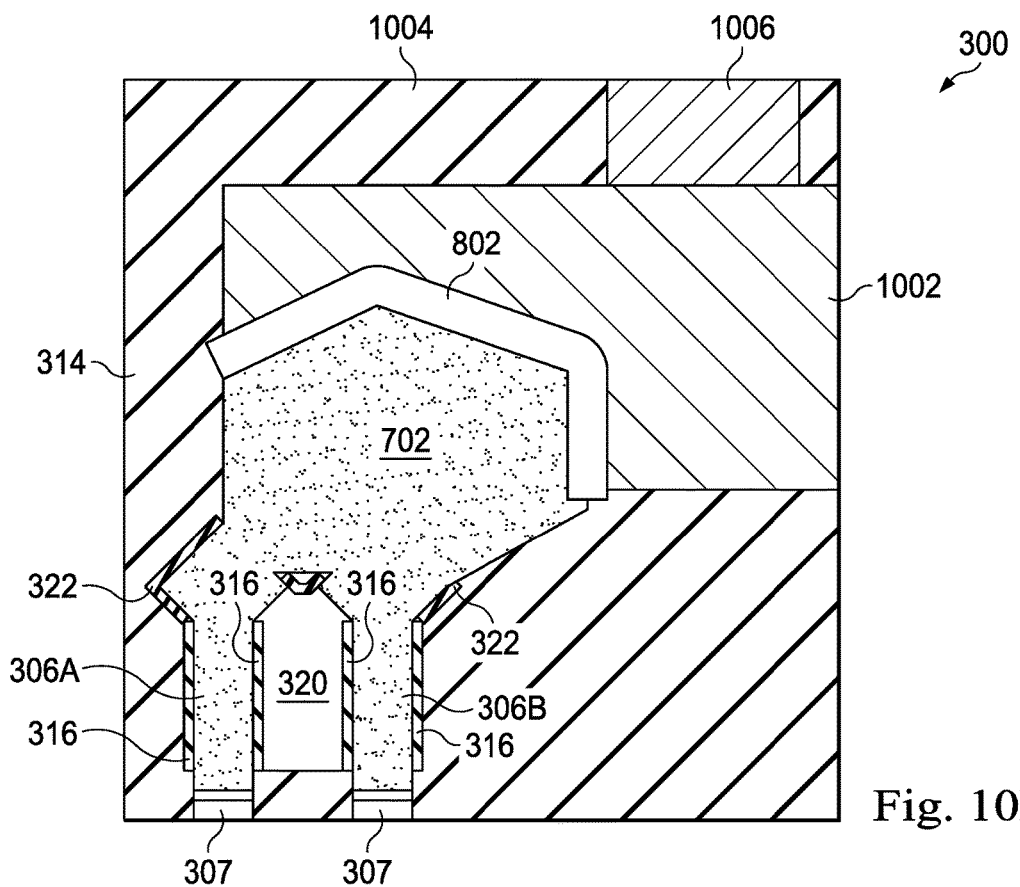

With reference to the example of FIGS. 9A and 9B, illustrated therein are views of the device 300, along section AA' of FIG. 1 (FIG. 9A) and along section BB' of FIG. 1 (FIG. 9B), after formation of the silicide layer 802, discussed above. Of particular note, in some embodiments and as shown in FIG. 9A, a top surface of the second semiconductor layer is higher than a top surface of the metal gate along a direction 'N' normal to the semiconductor substrate. The position of the top surface of the second semiconductor layer provides for the formation of the silicide layer 802 at a higher level, as discussed above, thereby avoiding detrimental stress relaxation.

In some embodiments, the method 200 then proceeds to block 214, where a contact metal is formed over silicide layer formed at block 212. In some embodiments, with reference to the examples of FIGS. 10A and 10B, a contact metal 1002 is formed over, and in contact with, the silicide layer 802. In some embodiments, the contact metal 1002 includes Ti, W, Co, Cu, Al, Mo, MoW, W, TiN, TaN, WN, silicides, combinations thereof, or other suitable conductive material. Thus, in some cases, the contact metal 1002 may include a plurality of layers. In some examples, the contact metal 1002 may be deposited in the openings (e.g., the openings 602, 604) to contact the silicide layer 802. Alternatively, after formation of the silicide layer 802 and in some examples, an ILD layer 1003 (e.g., similar to the ILD layer 314) may be deposited over the device 300 and patterned (e.g., by a suitable combination of lithographic patterning and wet and/or dry etching), to form openings that expose the silicide layer 802 and within which the contact metal 1002 is deposited. In some examples, after formation of the contact metal 1002, a CMP process may be performed to remove excess material (e.g., excess material of the contact metal 1002) and planarize a top surface of the device 300. Thereafter, in some embodiments and after formation of the silicide layer contact metal 1002, an ILD layer 1004 (e.g., similar to the ILD layer 314 and 1003) may be deposited over the device 300 and patterned (e.g., by a suitable combination of lithographic patterning and wet and/or dry etching), to form openings that expose the contact metal 1002 and within which a VIA metal layer 1006 is deposited. In some embodiments, the VIA metal layer 1006 includes Ti, W, Co, Cu, Al, Mo, MoW, W, TiN, TaN, WN, silicides, combinations thereof, or other suitable conductive material. In some examples, after formation of the VIA 1006, a CMP process may be performed to remove excess material (e.g., excess material of the VIA metal layer 1006) and planarize a top surface of the device 300.

The semiconductor device 300 may undergo further processing to form various features and regions known in the art. For example, subsequent processing may form various contacts/vias/lines and multilayers interconnect features (e.g., metal layers and interlayer dielectrics) on the substrate 102, configured to connect the various features to form a functional circuit that may include one or more FinFET devices. In furtherance of the example, a multilayer interconnection may include vertical interconnects, such as vias or contacts, and horizontal interconnects, such as metal lines. The interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200.

Figure 6A:
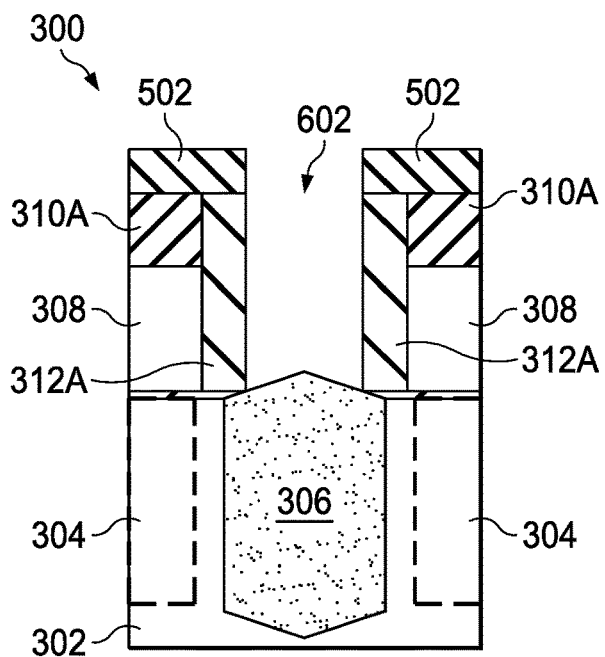
Figure 6B:
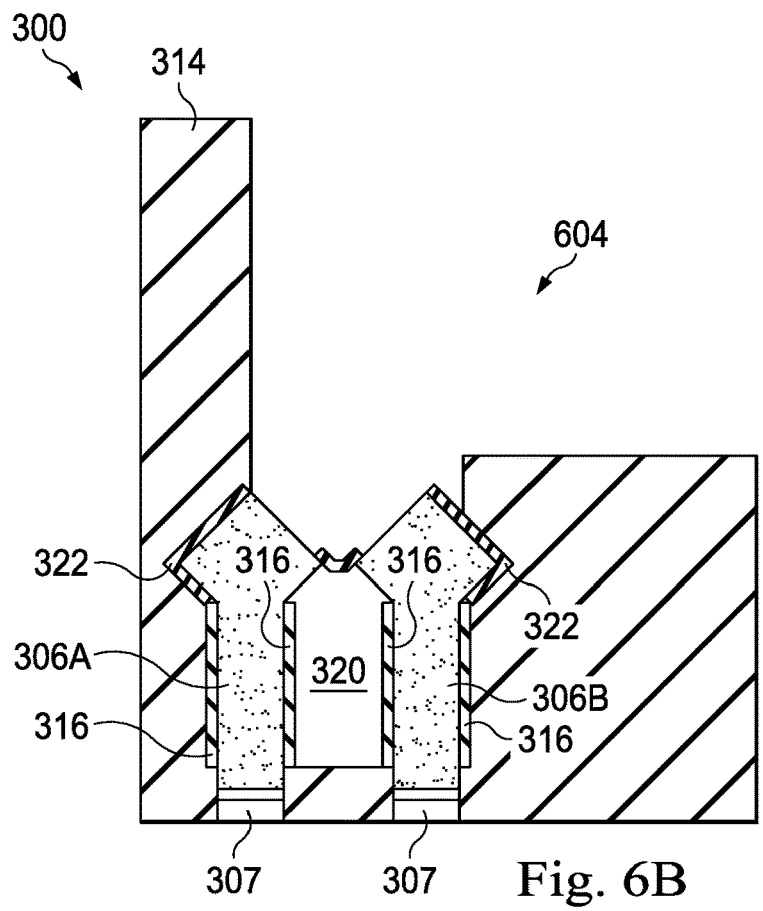
Figure 11:
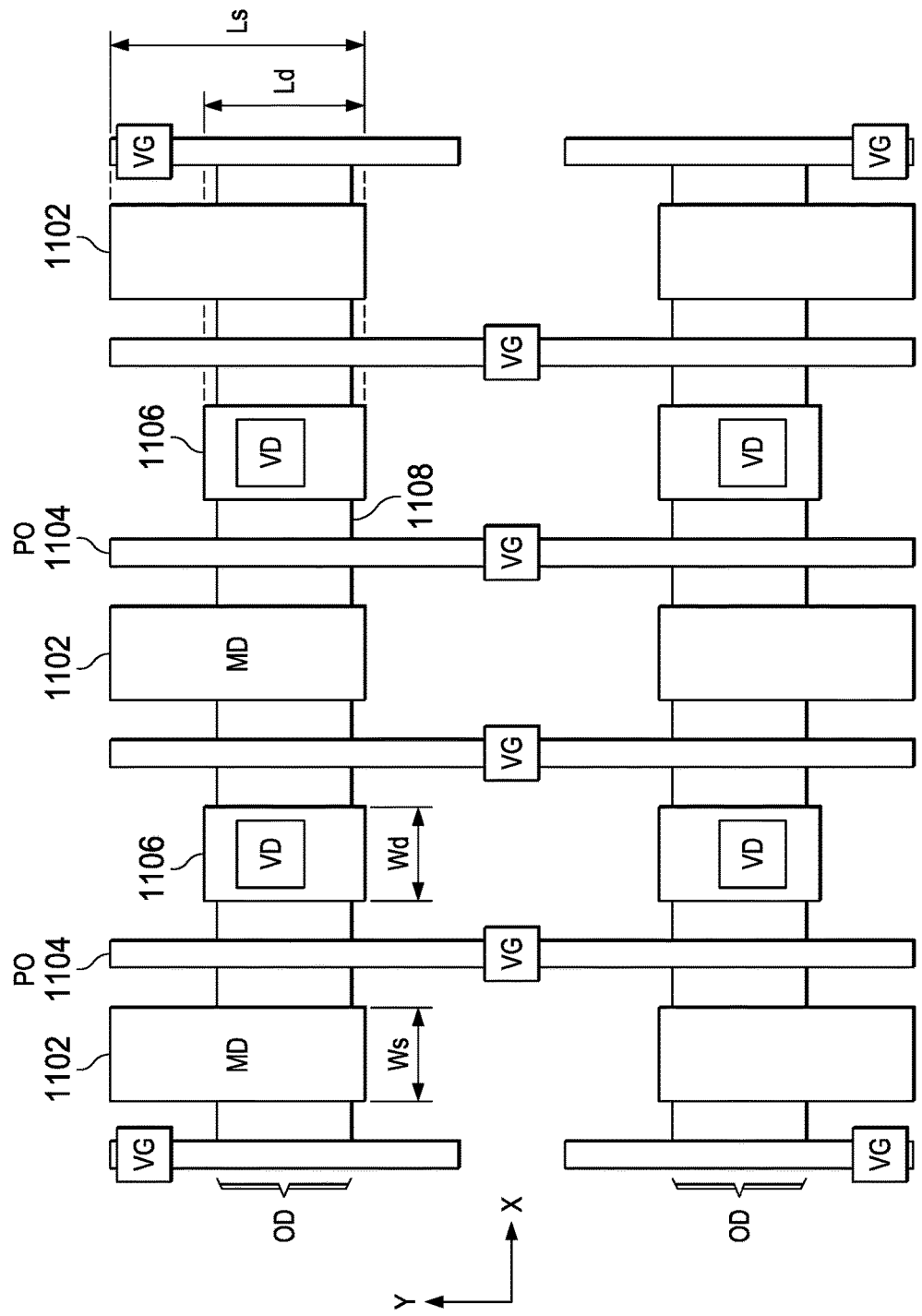
FIG. 11 provides a top view of an embodiment of a plurality of FinFET devices according to one or more aspects of the present disclosure.

Referring now to the example of FIG. 11, illustrated there is a top view of an embodiment of a plurality of FinFET devices according to one or more aspects of the present disclosure. In particular, FIG. 11 shows a fin element 1108 which may be the fin element 302, a gate structure 1104 which may be the gate structure 308, a gate contact 'VG', source regions 1102 and drain regions 1106. In some embodiments, the source/drain regions 1102, 1106 may be formed in substantially the same manner as described above with reference to the method 200 (e.g., formation of source/drain structures 306, 306A, 306B, formation of source/drain openings 602, 604, formation of the second epitaxial layer 702 and the silicide layer 802, and formation of the contact metal 1002 and the VIA 1006). As shown, the source regions 1102 have a source region width 'Ws' and a source region length 'Ls', and the drain regions 1106 have drain region width 'Wd' and a drain region length 'Ld'. Then dimensions of each of the source/drain regions 1102, 1106 may be defined by the openings 602, 604 as shown in FIGS. 6A/6B. Thus, the dimensions of each of the source/drain regions 1102, 1106 may also define a shape of the second epitaxial layer 702 and/or the silicide layer 802 formed over the second epitaxial layer 702. Moreover, FIG. 11 illustrates a manner in which the second epitaxial layer 702 and/or the silicide layer 802 may have an extended surface area that serves to reduce contact resistance. As described above, a similarly large opening may be used for both of a device source and drain such that each of the source/drain regions 1102, 1106 has similar dimensions. Alternatively, a larger opening may be used for one of a device source or drain to provide a smaller resistance at the one of the source or the drain having the larger opening. By way of example, and with reference to FIG. 11, openings (e.g., openings 602, 604) may be larger in the source region than in the drain region, and as a result the second epitaxial layer 702 and the silicide layer 802 may also be larger in the source region than in the drain region. In the example of FIG. 11, the source region 1102 is longer than the drain region 1106 along a direction perpendicular to a fin length direction. Stated another way, there is an asymmetry about a plane that center-cuts the fin along the fin length direction. FIG. 11 also illustrates a method, in accordance with the present embodiment, where first and second openings (e.g., openings 602, 604) may be formed separately for each of the source/drain regions 1102, 1106 such that sizes of each of the source/drain regions 1102, 1106 may be separately controlled.

The various embodiments described herein offer several advantages over the existing art. It will be understood that not all advantages have been necessarily discussed herein, no particular advantage is required for all embodiments, and other embodiments may offer different advantages. For example, embodiments discussed herein include methods and structures for providing a unique structure for FinFET S/D features that provide a reduced S/D contact resistance, improved FinFET channel stress, and lower capacitance. By way of example, such S/D features include stacked epitaxial (EPI) layers in each of the S/D regions. In some examples, the cascaded EPI features provided herein include a first EPI layer that is partially embedded in a fin over a semiconductor substrate, and a second EPI layer on top of the first EPI layer. By way of example, the two stacked EPI layers may be lattice-connected, and may have the same or different semiconductor material(s). In various examples, the second EPI layer may be partially self-aligned with the first EPI layer, and the shape of the second EPI layer may be defined at least in part by an opening in an inter-layer dielectric (ILD) layer disposed over the semiconductor substrate. In some cases, the FinFET device may further include a silicide feature over a top surface of the second EPI layer, where the silicide feature has an extended surface area for reducing S/D contact resistance.

Thus, one of the embodiments of the present disclosure described a semiconductor device including a substrate having a fin extending therefrom, the fin including a channel region, and source and drain regions adjacent to and on either side of the channel region. In various embodiments, a gate structure is disposed over the channel region, and the gate structure includes a metal layer disposed over a dielectric layer. In some examples, a first epitaxial layer at least partially embedded within the source and drain regions. In addition, a second epitaxial layer is disposed over the first epitaxial layer, where a top surface of the second epitaxial layer is higher than a top surface of the metal layer along a direction normal to the substrate. In various examples, a silicide layer is also disposed over, and in contact with, the second epitaxial layer.

In another of the embodiments, discussed is a method where a substrate including a fin extending therefrom is provided, and where the fin includes a channel region, and source and drain regions adjacent to and on either side of the channel region, and where a gate structure is disposed over the channel region. By way of example, a first epitaxial layer is formed at least partially embedded within the source and drain regions, and a dielectric layer is over the first epitaxial layer. In various embodiments, the dielectric layer is etched to form first and second openings that at least partially expose a top surface of the first epitaxial layer in the source region and the drain region respectively. Thereafter, in various examples, a second epitaxial layer is deposited over, and in contact with, the top surface of the first epitaxial layer. In some embodiments, the first and second epitaxial layers provide cascaded source and drain epitaxial features in each of the source and drain regions. In addition, a silicide layer may be formed over, and in contact with, the second epitaxial layer.

In yet another of the embodiments, discussed is a method where a substrate including a fin extending therefrom is provided. In various cases, the fin includes a channel region, and source and drain regions adjacent to and on either side of the channel region, and a gate structure disposed over the channel region. The gate structure includes a metal layer over a gate dielectric layer. In various embodiments, a first epitaxial layer is formed at least partially embedded within the source and drain regions, and the first epitaxial layer stresses the channel region. In various embodiments, a second epitaxial layer is formed over, and in contact with, the first epitaxial layer, and the second epitaxial layer has a larger surface area in the source region than in the drain region. In addition, in some embodiments, a top surface of the second epitaxial layer is higher than a top surface of the metal layer along a direction normal to the substrate. By way of example, a silicide layer may also be formed over, and in contact with, the second epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
   providing a substrate including a fin extending therefrom, wherein the fin includes a channel region, and source and drain regions adjacent to and on either side of the channel region, and wherein a gate structure is disposed over the channel region;
   forming a first epitaxial layer at least partially embedded within the source and drain regions;
   forming a dielectric layer over the first epitaxial layer;
   etching the dielectric layer to form first and second openings that at least partially expose a top surface of the first epitaxial layer in the source region and the drain region respectively;
   depositing a second epitaxial layer over, and in contact with, the top surface of the first epitaxial layer, wherein the first and second epitaxial layers provide cascaded source and drain epitaxial features in each of the source and drain regions; and
   forming a silicide layer over, and in contact with, the second epitaxial layer.

2. The method of claim 1, wherein the first opening is larger than the second opening.

3. The method of claim 1, further comprising prior to etching the dielectric layer, forming a protective sacrificial layer over the gate structure.

4. The method of claim 1, wherein the etching the dielectric layer exposes the top surface of the first epitaxial layer in at least two physically separated and adjacent fins, and wherein the depositing the second epitaxial layer serves to form a single, merged epitaxial region in at least one of the source and drain regions.

5. The method of claim 2, wherein the second epitaxial layer has a larger surface area in the source region than in the drain region.

6. The method of claim 5, wherein the silicide layer has a larger surface area in the source region than in the drain region.

7. The method of claim 1, wherein the gate structure includes a metal layer, and wherein a top surface of the second epitaxial layer is higher than a top surface of the metal layer along a direction normal to the substrate.

8. The method of claim 1, further comprising:
   after depositing the second epitaxial layer, performing a pre-amorphization implant (PAI) into the second epitaxial layer.

9. The method of claim 8, further comprising:
   after performing the PAI, depositing a metal layer over the second epitaxial layer; and
   performing an annealing process to form the silicide layer over, and in contact with, the second epitaxial layer.

10. The method of claim 1, wherein the channel region includes a first material, and wherein the first epitaxial layer includes a second material different than the first material.

11. The method of claim 8, wherein the first epitaxial layer applies stress to the channel region, and further comprising performing the PAI into the second epitaxial layer without relaxation of the applied stress to the channel region.

12. A method, comprising:
   providing a substrate including a fin extending therefrom, wherein the fin includes a channel region, and source and drain regions adjacent to and on either side of the channel region, and wherein a gate structure is disposed over the channel region, the gate structure including a metal layer;
   forming a first epitaxial layer at least partially embedded within the source and drain regions, wherein the first epitaxial layer stresses the channel region;
   forming a second epitaxial layer over, and in contact with, the first epitaxial layer, wherein the second epitaxial layer has a larger surface area in the source region than in the drain region, and wherein a top surface of the second epitaxial layer is higher than a top surface of the metal layer along a direction normal to the substrate; and
   forming a silicide layer over, and in contact with, the second epitaxial layer.

13. The method of claim 12, further comprising:
   prior to forming the second epitaxial layer, forming a first dielectric layer over the first epitaxial layer; and
   etching the first dielectric layer to form first and second openings that at least partially expose a top surface of the first epitaxial layer in the source region and the drain region respectively.

14. The method of claim 13, further comprising:
   after forming the silicide layer, forming a second dielectric layer over the silicide layer;
   patterning the second dielectric layer to form contact openings exposing the silicide layer and depositing a contact metal within the contact openings and in contact with the silicide layer;
   forming a third dielectric layer over the contact metal; and
   patterning the third dielectric layer to form via openings exposing the contact metal and depositing a via metal within the via openings and in contact with the contact metal.

15. The method of claim 12, further comprising:
after forming the second epitaxial layer, performing a pre-amorphization implant (PAI) into the second epitaxial layer.

16. The method of claim 15, further comprising:
after performing the PAI, depositing another metal layer over the second epitaxial layer; and
performing an annealing process to form the silicide layer over, and in contact with, the second epitaxial layer.

17. The method of claim 12, wherein the channel region includes a first material, and wherein the first epitaxial layer includes a second material different than the first material.

18. The method of claim 15, further comprising performing the PAI into the second epitaxial layer without relaxation of the stress to the channel region.

19. The method of claim 13, further comprising prior to etching the first dielectric layer, forming a sacrificial helmet layer over the gate structure.

20. The method of claim 19, further comprising prior to forming the sacrificial helmet layer, performing a pull-back process of a nitride layer overlying the gate structure and of a sidewall spacer formed on a sidewall of the gate structure.

* * * * *